US008568938B2

(12) United States Patent
Gao et al.

(10) Patent No.: US 8,568,938 B2
(45) Date of Patent: Oct. 29, 2013

(54) THERMOELECTRIC GENERATOR AND FUEL CELL FOR ELECTRIC POWER CO-GENERATION

(75) Inventors: Lijun Gao, Renton, WA (US); Shengyi Liu, Sammamish, WA (US); Chin-Hsi Chien, Bellevue, WA (US); George M. Roe, Seattle, WA (US)

(73) Assignee: The Boeing Company, Chicago, IL (US)

( * ) Notice: Subject to any disclaimer, the term of this patent is extended or adjusted under 35 U.S.C. 154(b) by 427 days.

(21) Appl. No.: 12/550,131

(22) Filed: Aug. 28, 2009

(65) Prior Publication Data

US 2011/0048484 A1    Mar. 3, 2011

(51) Int. Cl.
H01M 8/04    (2006.01)

(52) U.S. Cl.
USPC .............................. 429/436; 429/435; 429/440

(58) Field of Classification Search
None
See application file for complete search history.

(56) References Cited

U.S. PATENT DOCUMENTS

| | | | |
|---|---|---|---|
| 3,671,404 A | 6/1972 | Meckler et al. | |
| 5,228,923 A | 7/1993 | Hed | |
| 5,753,383 A | 5/1998 | Cargnelli et al. | |
| 6,029,620 A | 2/2000 | Zinke | |
| 6,096,966 A | 8/2000 | Nishimoto et al. | |
| 6,598,405 B2 | 7/2003 | Bell | |
| 2002/0148235 A1* | 10/2002 | Bell | 62/3.3 |
| 2004/0101750 A1 | 5/2004 | Burch | |
| 2005/0074645 A1 | 4/2005 | Fattic et al. | |
| 2005/0074646 A1 | 4/2005 | Rajashekara et al. | |
| 2005/0247336 A1 | 11/2005 | Inaoka | |
| 2005/0263176 A1 | 12/2005 | Yamaguchi et al. | |
| 2006/0003193 A1 | 1/2006 | Stabler et al. | |
| 2006/0130888 A1 | 6/2006 | Yamaguchi et al. | |
| 2006/0157102 A1 | 7/2006 | Nakajima et al. | |
| 2006/0225441 A1 | 10/2006 | Goenka et al. | |
| 2006/0251940 A1* | 11/2006 | Bandhauer et al. | 429/26 |
| 2008/0113228 A1* | 5/2008 | Whyatt et al. | 429/13 |
| 2008/0230618 A1 | 9/2008 | Gawthrop | |
| 2009/0020081 A1 | 1/2009 | Claypole et al. | |
| 2009/0139556 A1 | 6/2009 | Bell et al. | |
| 2011/0239964 A1 | 10/2011 | Prior | |

FOREIGN PATENT DOCUMENTS

| | | | |
|---|---|---|---|
| EP | 1038701 A2 | | 9/2000 |
| EP | 1679480 A1 | | 7/2006 |
| JP | 07-057754 | * | 3/1995 |
| JP | 09 289030 A | | 11/1997 |
| JP | 2000 173640 A | | 6/2000 |
| WO | WO 03/107463 | * | 12/2003 |
| WO | 2004092662 A1 | | 10/2004 |

OTHER PUBLICATIONS

Wayne Caswell, Dell H2C Technology: Hybrid Cooling for Overclocked CPUs, White Paper, dated Jan. 2007, Dell, Inc., 5 pages.

(Continued)

*Primary Examiner* — Jonathan Crepeau
(74) *Attorney, Agent, or Firm* — Toler Law Group, PC

(57) ABSTRACT

Systems and methods of electric power generation are disclosed. A particular method includes generating electric power using a fuel cell. The method also includes generating additional electric power using a thermoelectric generator (TE) by routing exhaust from the fuel cell to a hot side of the TE and routing fuel cell intake gases to a cold side of the TE. The method also includes preheating the fuel cell intake gases by routing the fuel cell intake gases from the TE through a heat exchanger (HX).

22 Claims, 7 Drawing Sheets

(56) References Cited

OTHER PUBLICATIONS

International Search Report and Written Opinion received for PCT Application No. PCT/US2010/042402 from the International Searching Authority (EPO) mailed Jan. 31, 2011, 12 pages.

Ishizawa Maki et al., Abstract—Thermoelectric Generation System Using Fuel-Cell Exhaust Heat, Transactions of the Institute of Electrical Engineers of Japan, 1999.

E. Fontell et al., Conceptual study of a 250 kW planar SOFC system for CHP application, Journal of Power Sources, www.elsevier.com, 2004, pp. 49-56, vol. 131.

S. Ghamaty et al., Si/SiGe Quantum Well Thermoelectric Materials and Devices for Waste Heat Recovery From Vehicles and Industrial Plants, Intl. Symposium, Jun. 11-12, 2007.

Eishiro Sasakawa et al., Performance of the Terrestrial Power Generation Plant Using the Alkali Metal Thermo-Electric Conversion (AMTEC), Aerospace Power, vol. 3, Aug. 1992, San Diego, California (8 pgs).

International Search Report and Written Opinion of the International Searching Authority, International Application No. PCT/US2010/042387, European Patent Office, Dec. 20, 2010, (13 pgs).

Communcation pursuant to Article 94(3) EPC; Application No. 10 736 932.4-1359, European Patent Office; Mar. 22, 2013; 5 pages.

U.S. Appl. No. 12/694,381, Final Office Action dated Feb. 15, 2013, (19 pgs).

* cited by examiner

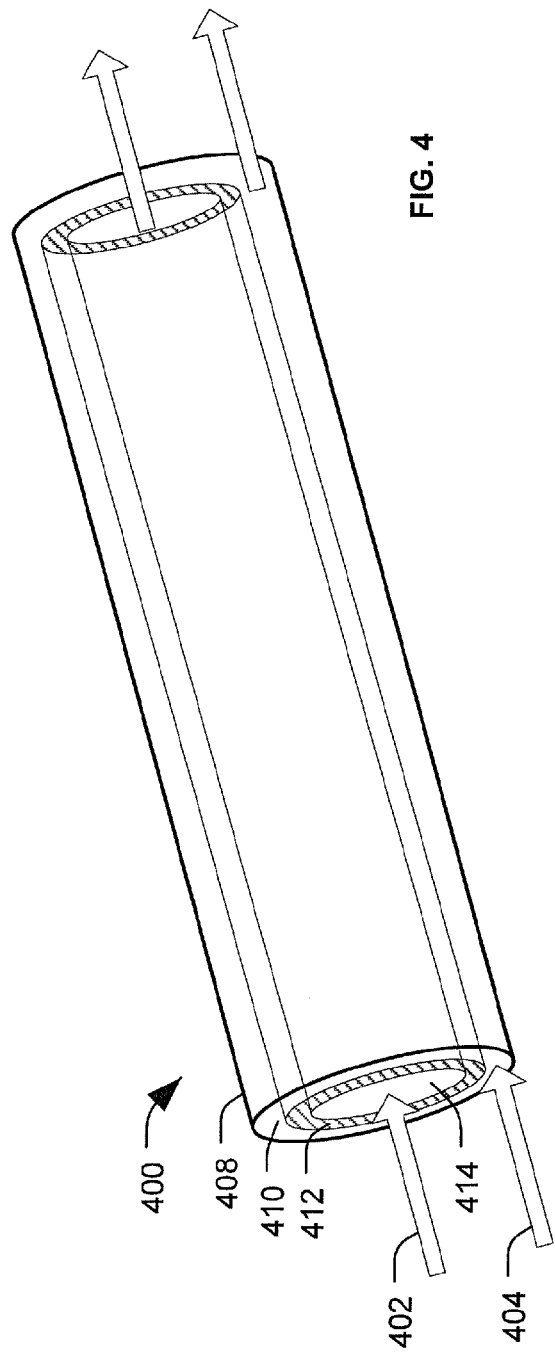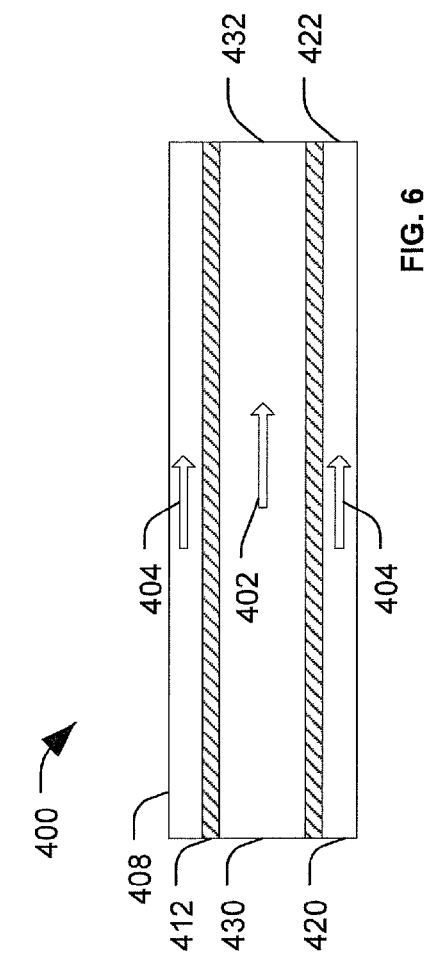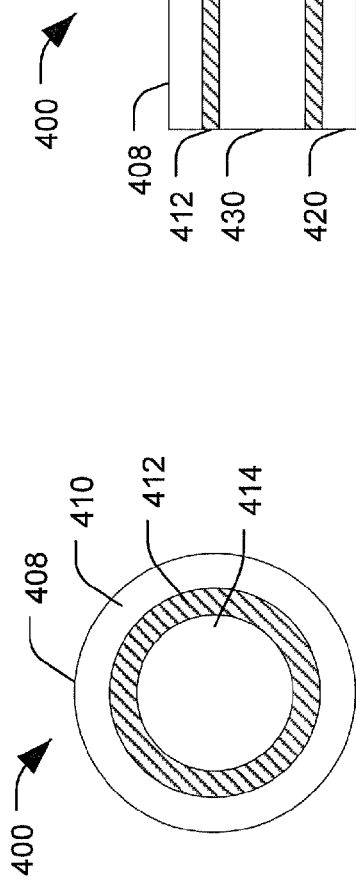

$T_i$: fuel cell inlet temperature $T_1$: fuel cell minimum inlet temperature $T_2$: fuel cell optimum inlet temperature $\Theta_{max}$: pre-set maximum valve open angle $\Theta_{min}$: pre-set minimum valve open angle $\Theta_{ctrl}$: valve open angle under control

THERMOELECTRIC GENERATOR AND FUEL CELL FOR ELECTRIC POWER CO-GENERATION

FIELD OF THE DISCLOSURE

The present disclosure is generally related to generation of electric power.

BACKGROUND

A thermoelectric generator can produce electric energy based on a temperature differential experienced across a thermoelectric device. The amount or rate of electric energy generation by a thermoelectric generator may depend on the magnitude of the temperature differential across it. For example, a large temperature differential may result in a higher rate of energy generation. A thermoelectric generator system may utilize a high temperature heat source and a cooling system to maintain a high magnitude temperature differential in order to achieve an efficient energy conversion.

SUMMARY

Systems and methods of electric power generation are disclosed. In a particular embodiment, electric power is generated using a power cogeneration system. The power cogeneration system may use both a fuel cell and a thermoelectric generator to generate electric power. The fuel cell may generate electric power based on a chemical reaction between a fuel and an oxidizer. The fuel cell may also generate heat as a byproduct of the chemical reaction. The thermoelectric generator may generate additional electric power based on a temperature differential between an intake fluid provided to the fuel cell (e.g., oxidizer or fuel) and hot exhaust (from an anode or a cathode) of the fuel cell.

In a particular embodiment, a method includes generating electric power using a fuel cell. The method also includes generating additional electric power using a thermoelectric generator (TE) by routing exhaust from the fuel cell to a hot side of the TE and routing fuel cell intake gases to a cold side of the TE. The method also includes preheating the fuel cell intake gases by routing the fuel cell intake gases from the TE through a heat exchanger (HX) to recover heat from the fuel cell exhausts received from the hot side of the TE.

In another particular embodiment, a system includes a fuel cell having a fuel cell inlet to receive preheated intake gas and a fuel cell outlet to release hot fuel cell exhaust. The system also includes a heat exchanger (HX) having a HX cold-side inlet, a HX cold-side outlet, a HX hot-side inlet and a HX hot-side outlet. The system further includes a thermoelectric generator (TE) to generate electric energy based on a temperature differential between a TE cold-side and a TE hot-side. The TE includes a TE cold-side inlet to receive intake stream, a TE cold-side outlet coupled to the HX cold-side inlet, a TE hot-side inlet coupled to the fuel cell outlet to receive the hot fuel cell exhaust, and a TE hot-side outlet coupled to the HX hot-side inlet.

In yet another embodiment, a platform, such as a mobile platform (e.g., an aircraft, a spacecraft, a water craft, a land-based vehicle, or another mobile platform) or a stationary platform (e.g., a power generation system of a stationary structure, or another stationary platform), includes a fuel cell to generate electric power. The platform also includes a thermoelectric generator (TE) to generate additional electric power using a temperature differential between fuel cell exhaust from the fuel cell and fuel cell intake gases. The platform further includes a heat exchanger (HX) to preheat the fuel cell intake gases before the fuel cell intake gases are provided to the fuel cell by recovering heat from the fuel cell exhaust after the fuel cell exhaust has passed through the TE.

BRIEF DESCRIPTION OF THE DRAWINGS

FIG. 4-6 are views of a thermoelectric generator according to a particular embodiment;

DETAILED DESCRIPTION

The features, functions, and advantages that are described can be achieved independently in various embodiments disclosed herein or may be combined in yet other embodiments further details of which can be shown with reference to the following description and drawings.

Operational efficiency of a cogeneration system may be improved by placing a thermoelectric generator between a relatively hot exhaust stream from a fuel cell and a relatively cold intake stream to the fuel cell. This arrangement enables the thermoelectric generator to generate electric power based on the relatively large temperature differential between the hot exhaust stream and the cold intake stream without using an additional cooling system. Additionally, this arrangement enables preheating of the cold intake stream before it is provided to the fuel cell. The efficiency of the thermoelectric generator may be increased due to the high magnitude of the temperature differential between the fuel cell exhaust stream and the fuel cell intake stream. Further, this arrangement does not require use of additional fuel to generate the temperature differential used by the thermoelectric generator to produce power; rather, waste heat in the fuel cell exhaust stream is used by the thermoelectric generator to produce power. Additionally, the weight of the cogeneration system is reduced with respect to other cogeneration systems since a separate cooling system is eliminated.

In a particular embodiment, a platform using the disclosed cogeneration system does not need an additional cooling system to cool exhaust from the fuel cell. Further, additional power is generated by the thermoelectric generator using what would otherwise be waste heat from the fuel cell. Thus, part of the power is recovered from the waste heat leading to improved efficiency of conversion of the fuel into electric power by the cogeneration system.

Figure 1:
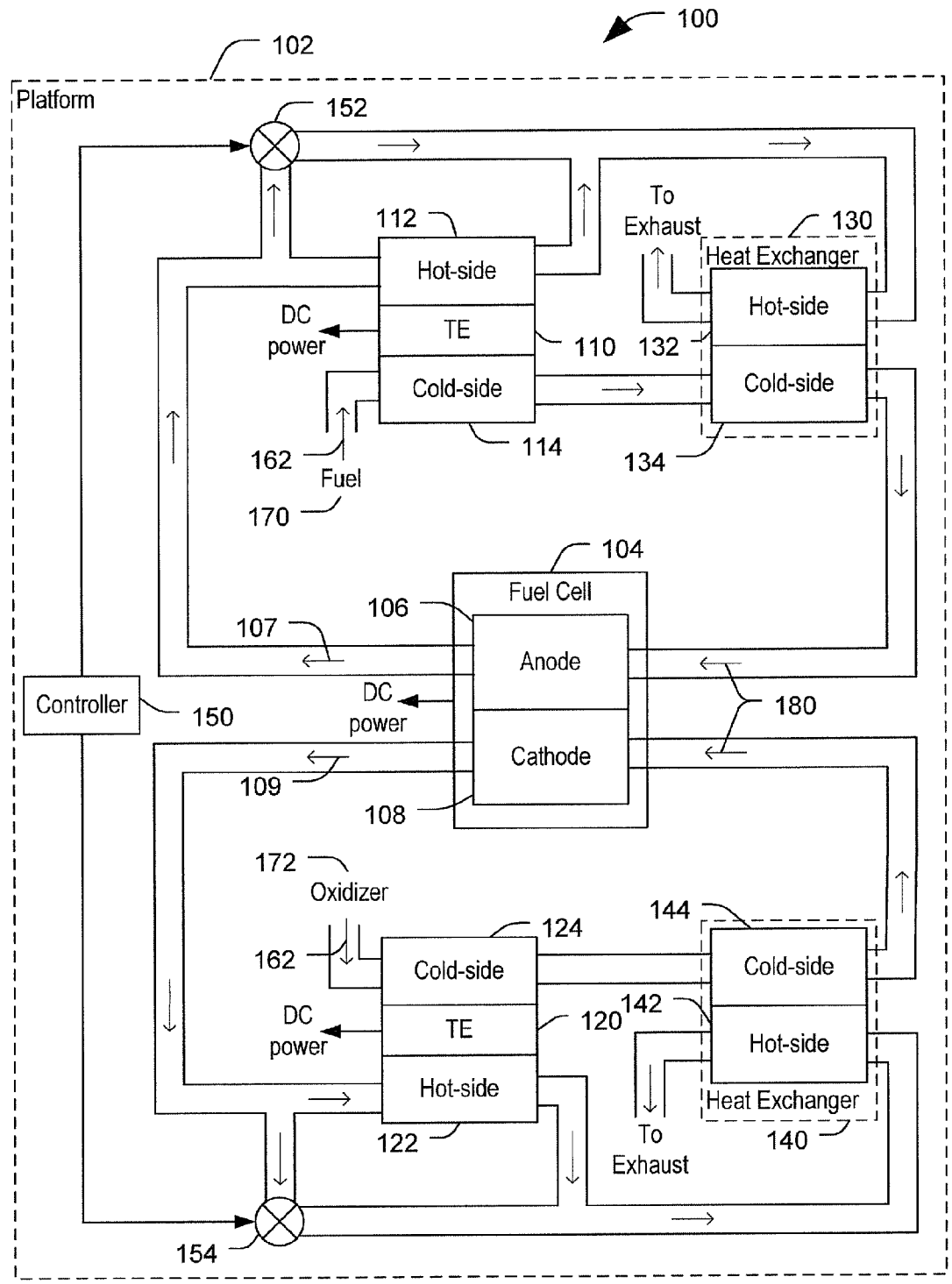
FIG. 1 is a diagram of a first embodiment of a system to generate electric power.

FIG. 1 is a diagram of a first embodiment of a system to generate electric power, the system generally designated 100. The system 100 includes a platform where a power generation system is situated. For example, the platform can be a mobile platform, such as an aircraft, a space craft, a watercraft, or a land-based vehicle. In another example, the platform can be a stationary platform, such as a power generation system in a utility power plant, an industrial site, an office building, or another substantially stationary structure. In a particular embodiment, the power generation system of the platform 102 includes components to generate electric power. For example the components to generate electric power may include a fuel cell 104 having an anode 106 and a cathode 108. The components to generate electric power may also include one or more thermoelectric generators (TE), such as a first TE 110 and a second TE 120.

In a particular embodiment, the first TE 110 is coupled to the anode 106 of the fuel cell 104, and the second TE 120 is coupled to the cathode 108 of the fuel cell 04. This arrangement may enable hot exhaust gas 107 from the anode 106 to be routed to a hot side 112 of the first TE 110. Likewise, hot exhaust gas 109 from the cathode 108 may be routed to a hot side 122 of the second TE 120. Intake gases 162 (such as, fuel 170 and oxidizer 172) that are cool by comparison to the hot exhaust gases 107, 109 may be received at inlets (e.g., from respective fuel and oxidizer storage systems) and routed through respective cold sides 114, 124 of the TEs 110, 120. In this arrangement, the TEs 110, 120 may be at or near a point of maximum temperature differential between the hot exhaust gases 107, 109 and the intake gases 162. In an illustrative embodiment, the fuel cell 104 is a high temperature fuel cell, such as a solid oxide fuel cell (SOFC). With a SOFC, the hot exhaust gases 107, 109 may have a temperature greater than 600° C. For example, the hot exhaust gases 107, 109 may have a temperature between about 600° C and about 800° C. A temperature of the intake gases 162 may depend on, among other things, the operating environment of the system 100. For example, when ambient air is used as the oxidizer 172, the temperature of the ambient air may be less than about 50° C. When the power generation system of the platform 102 is operated by or near humans, the ambient air may typically be between about −50° C. and 50° C. For purposes of a particular implementation, the intake gases 162 may be assumed to be approximately 20° C. It is understood that the temperature of the hot exhaust gases 107, 109 and the temperature of the intake gases 162 may vary widely depending on the particular embodiment, a particular application or use of the system 100 and specific operating conditions. Accordingly, the temperatures described above are exemplary and not intended as limitations.

The system 100 may also include a first heat exchanger 130 coupled to the anode 106 and a second heat exchanger 140 coupled to the cathode 108. In a particular embodiment, exhaust gases from the hot sides 112, 122 of the TEs 110, 120 may be routed to respective inlets of hot sides 132, 142 of the heat exchangers 130, 140. Exhaust from the cold sides 114, 124 of the TEs 110, 120 may be routed to respective inlets of cold sides 134, 144 of the heat exchangers 130, 140. In this embodiment, the heat exchangers 130, 140 may preheat the intake gases 162 before the intake gases 162 are provided to the fuel cell 104 as preheated intake gas 180. Preheating the intake gas 180 may enable efficient operation of the fuel cell 104, especially when the fuel cell 104 is a high temperature fuel cell. In a particular embodiment, the heat exchangers 130, 140 are counter-flow heat exchangers; however, in other embodiments the heat exchangers 130, 140 may have other physical arrangements.

In a particular embodiment, the system 100 may be operated to increase the operational efficiency of the fuel cell 104. Accordingly, a controller 150 may operate a first control valve 152, a second control valve 154, or both, to control a temperature of the preheated intake gas 180 provided to the fuel cell 104. In a particular embodiment, the control valves 152, 154 are between a fuel cell outlet and a heat exchanger hot-side inlet. The control valves 152, 154 are adjustable to control an inlet temperature of the preheated intake gas 180. For example, the controller 150 may operate the control valves 152, 154 to allow a portion of the hot exhaust gases 107, 109 to bypass the TEs 110, 120 in order to increase the temperature of the preheated intake gas 180. When the control valves 152, 154 are opened (such that at least a portion of the hot exhaust gases 107, 109 bypass the TEs 110, 120, the temperature of the gas provided to the respective hot sides 132, 142 of the heat exchangers 130, 140 is increased, which increases the temperature of the preheated intake gas 180 exiting the respective cold sides 134, 144 of the heat exchangers 130, 140. Thus, an amount of preheating of the preheated intake gas 180 may be controlled by the controller 150 through operation of the control valves 152, 154. In a particular embodiment, the controller 150 operates the first control valve 152 to achieve and/or maintain a predetermined temperature of the preheated intake gas 180. For example, the predetermined temperature of the preheated intake gas 180 may be a temperature selected to optimize power generation by the fuel cell 104. Thus, the TEs 110, 120 may generate power using waste heat from the fuel cell 104. That is, in a particular embodiment, the fuel cell 104 may be operated as though it were a stand alone fuel cell, and the TEs 110, 120 may recover waste heat produced by the fuel cell 104 to generate additional electric power. In an illustrative embodiment, the predetermined temperature of the preheated intake gas 180 may be about 600° C. Thus, power generated by the fuel cell 104 may be increased and, when needed, cogeneration power provided by the TEs 110, 120 may be decreased to provide additional preheating of the preheated intake gas 180 to enable operation of the fuel cell 104 or to improve operational efficiency of the fuel cell 104. In another particular embodiment, the controller 150 operates the control valves 152, 154 to maximize, optimize or otherwise control total power output generated by the combination of the fuel cell 104 and the TEs 110, 120. For example, the controller 150 may monitor power output from the TEs 110, 120 and may adjust the control valves 152, 154 to maximize, optimize or otherwise control the power output based on a control scheme.

In a particular embodiment, one or more components of the system 100 may be merged with another component or may be omitted from the system 100. For example, only one TE may be present, only one control valve may be present, only one heat exchange may be present, or any combination thereof.

In another particular embodiment, waste heat may be recovered only from the hot exhaust 107 from the anode 106 or only from the hot exhaust 109 from the cathode 108. In this embodiment, only one set of heat recovery systems (such as the TEs 110, 120 and heat exchangers 130, 140), cogeneration systems (such as the TEs 110, 120), and control systems (such as the control valves 152, 154), may be present.

Figure 2:
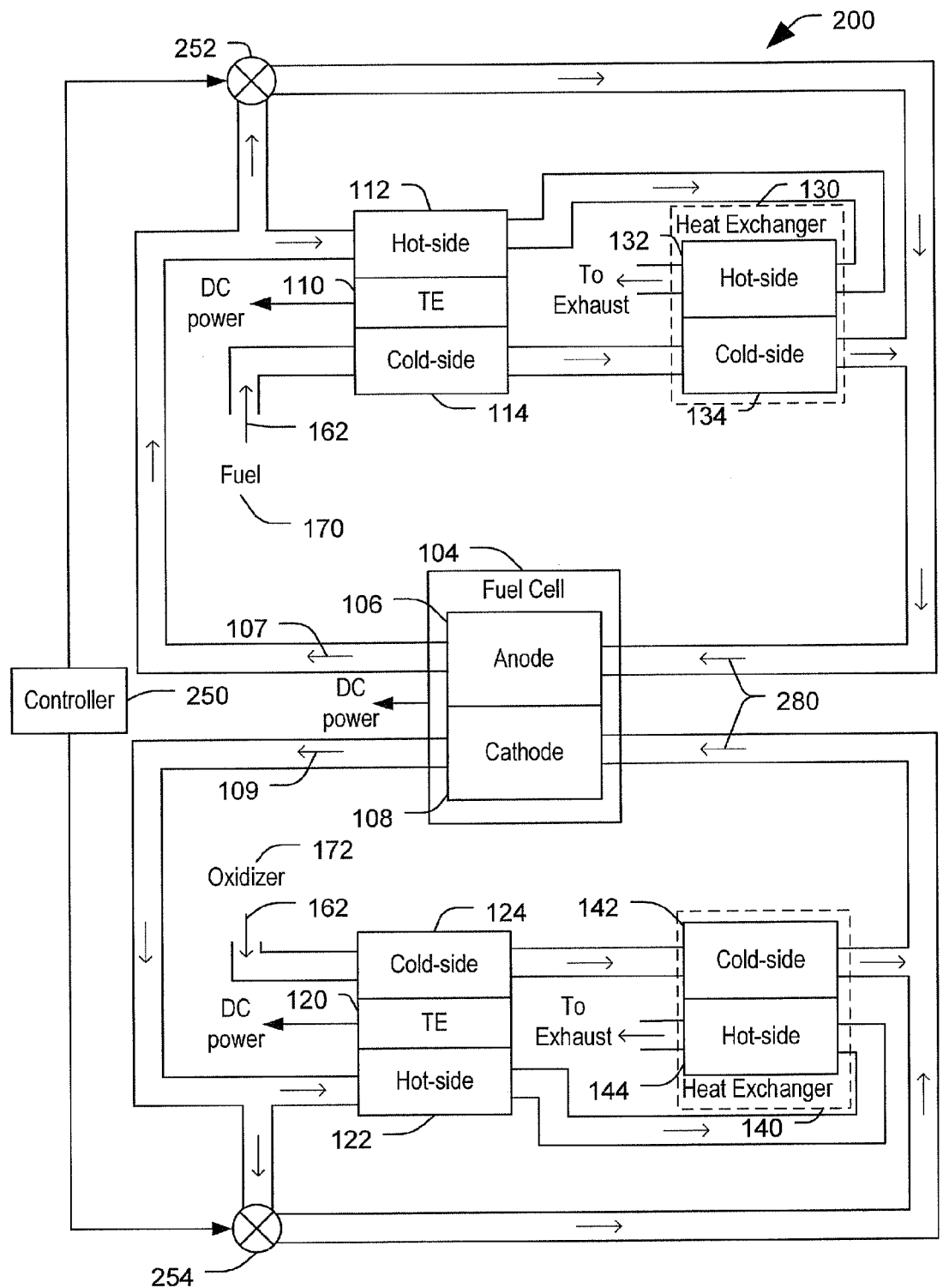
FIG. 2 is a diagram of a second embodiment of a system to generate electric power.

FIG. 2 is a diagram of a second embodiment of a system to generate electric power, the system generally designated 200. In a particular embodiment, the system 200 includes many elements that are the same as or substantially similar to elements of the system 100. Such elements have the same reference number as in FIG. 1 for ease of reference and description.

In the system 200, a controller 250 controls one or more control valves 252, 254. The control valves 252, 254 are positioned between a fuel cell outlet and a fuel cell inlet (rather than between the fuel cell outlet and the heat exchanger hot-side inlet as in the system 100 of FIG. 1). Thus, the control valves 252, 254 control an amount of the hot exhaust gases 107, 109 that bypass both the TEs 110, 120 and the heat exchanger 130, 140. The control valves 252, 254 are operable to control preheating of preheated intake gas 280 routed to the fuel cell by controlling a portion of the hot exhaust gases 107, 109 that is mixed directly into the preheated intake gas 280. For example, a first portion of the hot exhaust gases 107, 109 may be routed to an intake of the fuel cell 104 and a second portion of the hot exhaust gases 107, 109 may be routed through the TEs 110, 120 and the heat exchanger 130, 140 based on a position of the control valves 252, 254.

Figure 3:
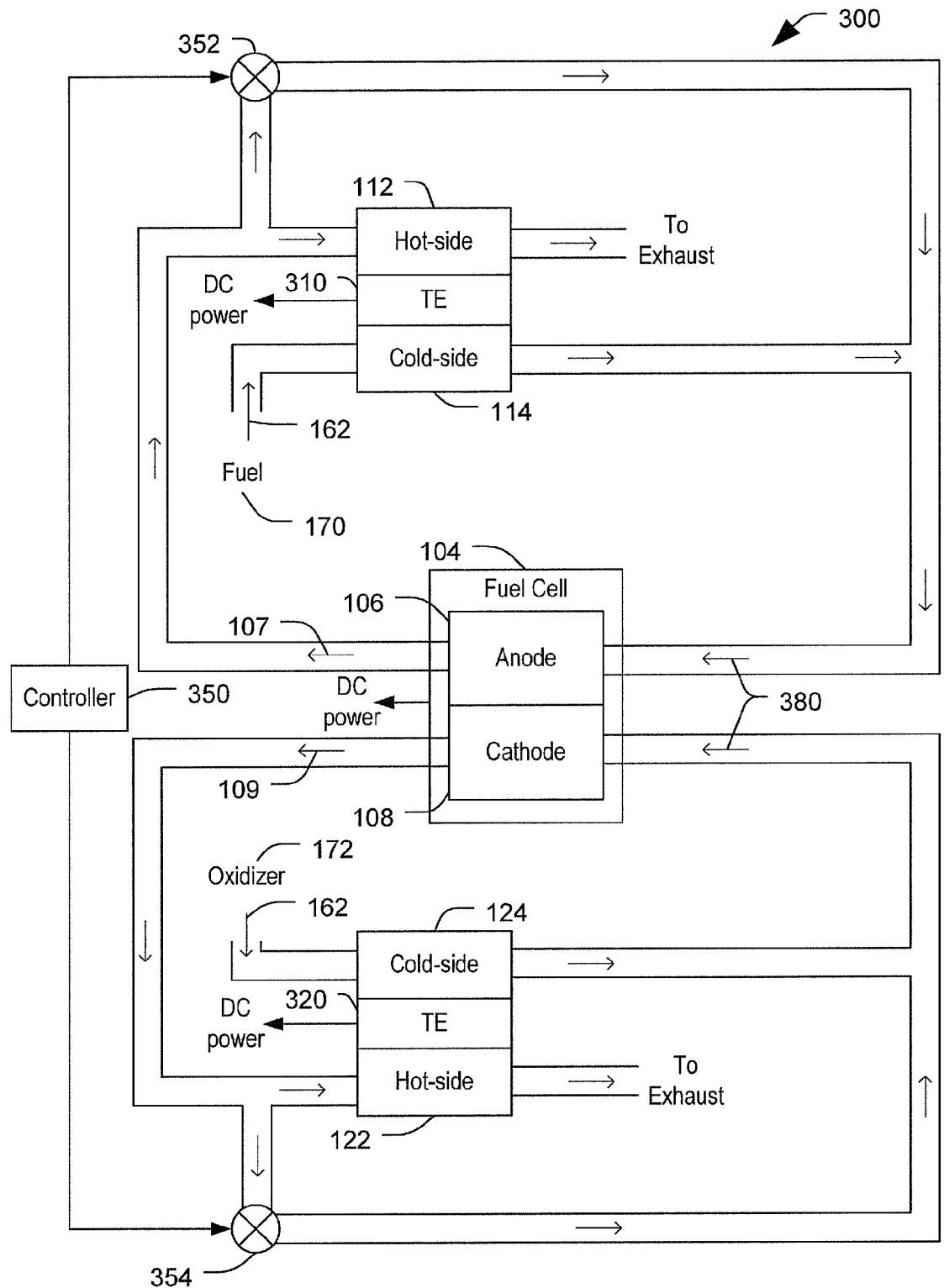
FIG. 3 is a diagram of a third embodiment of a system to generate electric power.

FIG. 3 is a diagram of a third embodiment of a system to generate electric power, the system generally designated 300. In a particular embodiment, the system 300 includes many elements that are the same as or substantially similar to elements of the system 100. Such elements have the same reference number as in FIG. 1 for ease of reference and description.

In the particular embodiment of FIG. 3, no heat exchangers, such as the heat exchangers 130 and 140 of FIGS. 1 and 2, are present. Rather, TEs 310, 320 coupled to outlets of the fuel cell 104 exchange heat between the hot exhaust gases 107, 109 and the intake gases 162 in addition to generating power based on a temperature differential between the hot exhaust gases 107, 109 and the intake gases 162. A controller 350 controls one or more control valves 352, 354 that are positioned between the fuel cell outlet and the fuel cell inlet. Thus, the control valves 352, 354 control an amount of the hot exhaust gases 107, 109 that bypass TEs 310, 320. The control valves 352, 354 are operable to control preheating of preheated intake gas 380 routed to the fuel cell 104 by controlling a portion of the hot exhaust gases 107, 109 that is mixed directly into the preheated intake gas 380 from the cold sides 114, 124 of the TEs 310, 320.

FIGS. 4-6 are perspective end and side views, respectively, of a thermoelectric generator (TE) 400 according to a particular embodiment. The TE 400 may be any one or more of the TEs 110, 120 described with reference to FIGS. 1 and 2. The TE 400 a thermoelectric device 412 generates electricity based on a temperature differential between the hot side 414 of the thermoelectric device 412 and the cold side 410 of the thermoelectric device 412. In a particular embodiment, the hot side 414 has a hot-side inlet 430 and a hot side outlet 432. The hot side 414 may be adapted to receive hot fluids 402, such as the hot exhaust gases 107, 109 from a high temperature fuel cell, as described with reference to FIGS. 1 and 2. The cold side 410 may have a cold-side inlet 420 and a cold-side outlet 422. The cold side 410 may be adapted to receive cold fluids 404, such as the intake gases 162, as described with reference to FIGS. 1 and 2. It is understood that "hot" and "cold" are relative terms and, as used herein, indicate a temperature differential between the respective fluids 402, 404. That is, the hot fluid 402 has a higher temperature than the cold fluid 404.

The hot side 414 is separated from the cold side 410 by the thermoelectric device 412. The thermoelectric device 412 may include bimetal junctions, bismuth-telluride semiconductor junctions, other materials capable of generating electric energy based on temperature differentials, or any combination thereof. In the illustrated embodiment, the TE 400 is radial or annular, with the cold side 410 surrounding the hot side 414. That is, a region of the TE 400 that receives hot fluids (the hot side 402) may be at a center of a tube and may be separated from an outer region of the TE 400 that receives cold fluids (the cold side 404) by the thermoelectric device 412. In this embodiment, an outer casing 408 may be provided around the cold side 410. However, in other embodiments the TE 400 may have a physical arrangement other than annular, such as parallel plates. Also, the illustrated embodiment is arranged for co-flow, or flow of the hot fluid 402 in the same direction as the cold fluid 404. However, in other embodiments, the TE 400 is counter flow, with the hot fluid 402 flowing in a direction opposite the cold fluid 404. The TE 400 may also have power connectors (not shown) to enable electricity generated by the TE 400 to flow to a circuit.

Figure 7:
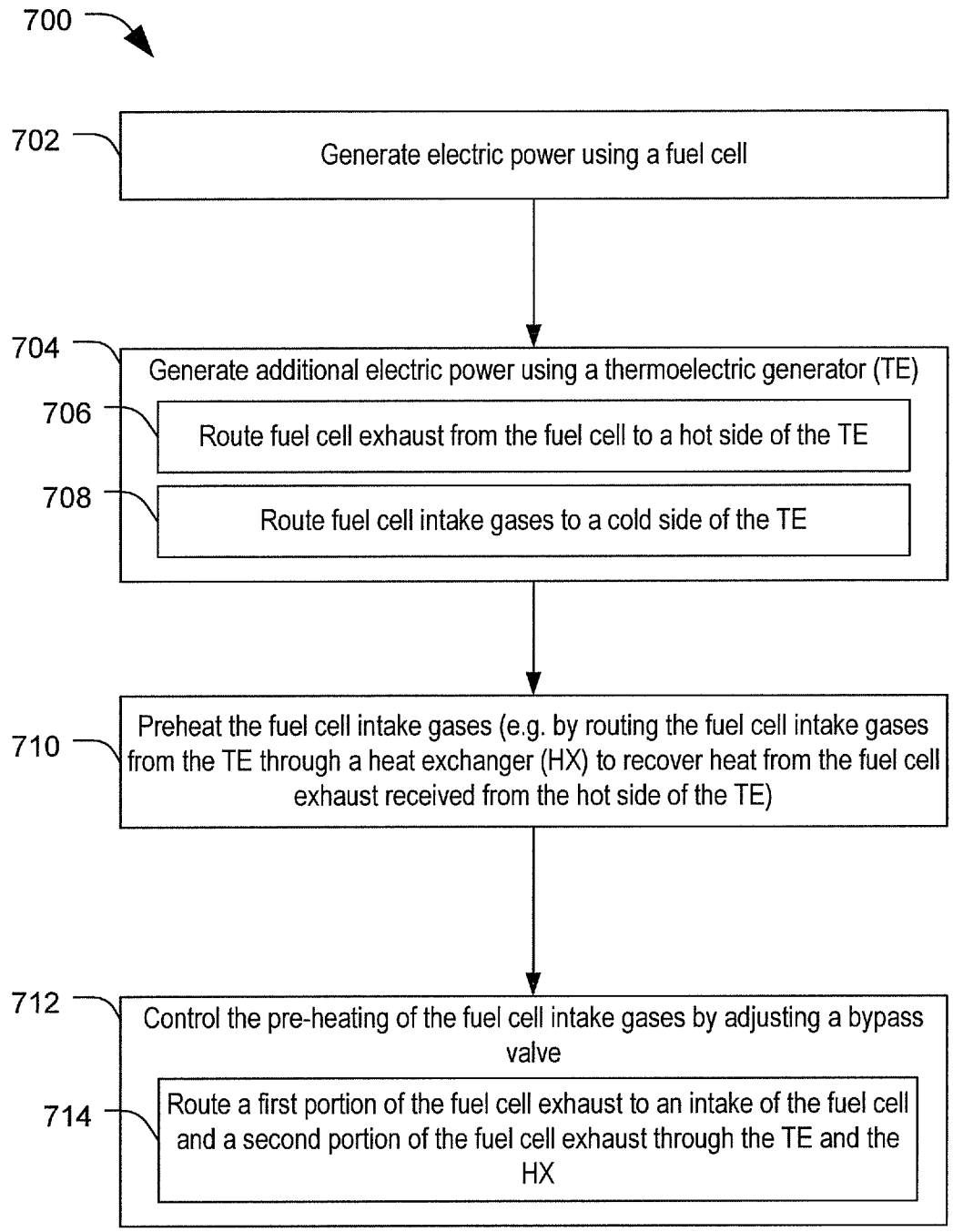
FIG. 7 is a flow chart of a first embodiment of a method of generating electric power.

FIG. 7 is a flow chart of a first embodiment of a method of generating electric power, the method generally designated 700. The method 700 may include, at 702, generating electric power using a fuel cell. For example, the fuel cell 104 discussed with references to FIGS. 1 and 2 may generate electric current using a chemical reaction between a fuel and an oxidizer. In a particular embodiment, the fuel cell may be a high temperature fuel cell, such as a solid oxide fuel cell.

The method 700 may also include, at 704, generating additional electric power using a thermoelectric generator (TE). The TE may generate the additional electric power based on a temperature differential across a thermoelectric device. For example, the thermoelectric device 412 described with reference to FIGS. 4-6 may be used to generate the additional electric power based on a temperature differential between a cold side of the TE and a hot side of the TE. In a particular embodiment, the method 700 includes, at 706, routing fuel cell exhaust from the fuel cell to the hot side of the TE and, at 708, routing fuel cell intake gases to the cold side of the TE. Thus, a temperature differential between the fuel cell exhaust and the fuel cell intake gases may be used to generate the additional electric power at the TE.

In a particular embodiment, operation of the fuel cell may be enabled or operational efficiency of the fuel cell may be improved when the fuel cell intake gases are preheated. In this embodiment, the method also includes, at 710, preheating the fuel cell intake gases by routing the fuel cell intake gases from the TE through a heat exchanger (HX) to recover heat from the fuel cell exhaust received from the hot side of the TE. The method may also include, at 712, controlling preheating of the fuel cell intake gases by adjusting a bypass valve. For example, a first portion of the fuel cell exhaust may be routed to an intake of the fuel cell and a second portion of the fuel cell exhaust may be routed through the TE and the HX, at 714, based on a position of the bypass valve.

Figure 8:
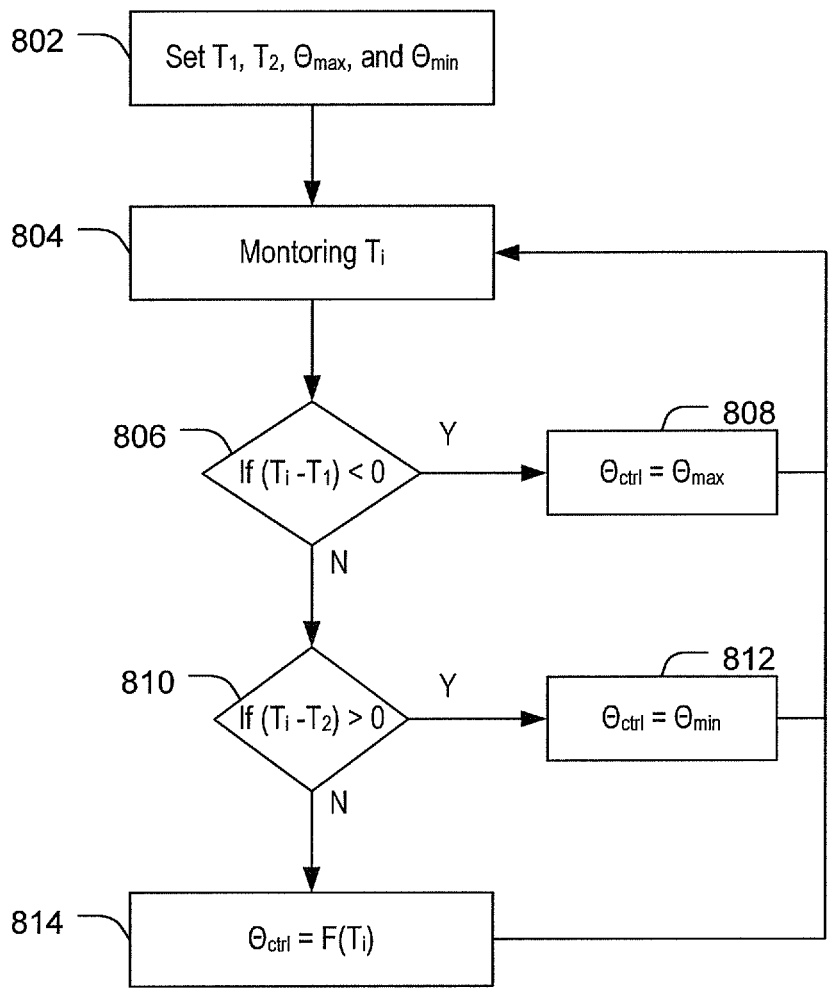
FIG. 8 is a flow chart of a control scheme to control generation of electric power according to a particular embodiment.

FIG. 8 is a flow chart of a control scheme to control generation of electric power according to a particular embodiment. For example, the control scheme illustrates control laws that may be used by a controller to manipulate control valves to regulate power generated by a cogeneration system, such as the system 100 or the system 200 as described with reference to FIG. 1 and FIG. 2, respectively. The control scheme includes, at 802, setting control parameters of the controller. The input parameters may include a fuel cell minimum inlet temperature, $T_1$, and a fuel cell optimum (or desired) inlet temperature, $T_2$. In a particular embodiment, $T_2$ may be selected to increase an amount of electric power output by the fuel cell. For example, when the fuel cell is a high-temperature fuel cell, $T_2$ may be a relatively high temperature, e.g., in the hundreds of degrees Celsius, to improve operational efficiency of the fuel cell. $T_1$ may be selected based on operational criteria of the fuel cell. For example, the fuel cell may generate minimal power or no power until a minimum operational temperature of the fuel cell is reached. $T_1$ may be selected to keep the fuel cell above this minimum operational temperature.

The input parameters may also include valve open angles, such as a minimum valve open angle, $\theta_{min}$, and a maximum valve open angle, $\theta_{max}$. The minimum valve open angle $\theta_{min}$ may be a minimum amount that a control valve, such as one of the control valves 152, 154 of FIG. 1 or 252, 254 of FIG. 2, can be opened. The maximum valve open angle $\theta_{max}$ may be a maximum amount that the control valve can be opened.

At 804, the controller may monitor an inlet temperature, $T_i$, of the fuel cell. For example, a thermocouple or other temperature monitoring device may detect, in real-time or near real-time, the temperature of the intake gases 180 of FIG. 1 or the temperature of the intake gases 280 of FIG. 2. Based on $T_i$, the controller may adjust an open angle $\theta_{ctrl}$, the control variable, of the control valve. For example, at 806, when $T_i$ minus $T_1$ is less than 0 (zero), the controller may adjust the valve open angle $\theta_{ctrl}$ to be equal to the maximum valve open angle $\theta_{max}$, at 808, to maximize preheating of the fuel cell inlet gases. At 810, when $T_i$ minus $T_2$ is greater than 0 (zero), the controller may adjust the valve open angle $\theta_{ctrl}$ to be equal to the minimum valve open angle $\theta_{min}$, at 812, to minimize preheating of the fuel cell inlet gases. When $T_i$ minus $T_1$ is not less than 0 (zero) and $T_i$ minus $T_2$ is not greater than 0 (zero), the controller may implement a control function, $F(T_i)$, to select the valve open angle $\theta_{ctrl}$. For example, the control function may be a proportional control function, a derivative control function, an integral control function, another control function, or any combination thereof.

Figure 9:
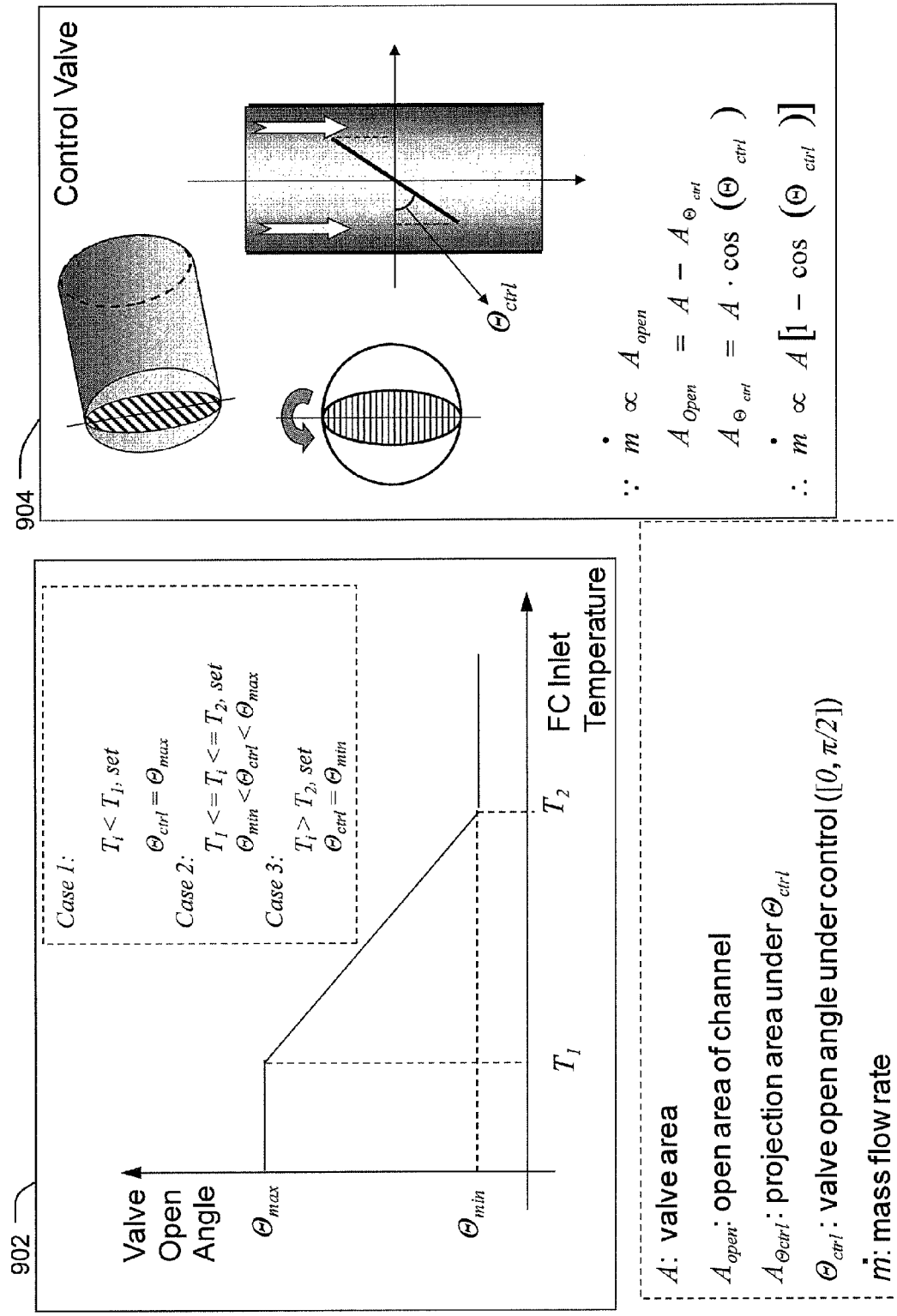
FIG. 9 is a diagram illustrating control of a system to generate electric power according to a particular embodiment.

FIG. 9 is a diagram further illustrating the control scheme of FIG. 8, according to a particular embodiment. FIG. 9 includes a graph 902 of the valve open angle versus the fuel cell inlet temperature, $T_i$, in one embodiment of the control scheme. The graph 902 shows that, when $T_i$ is less than $T_1$, the control valve is opened to a maximum value, $\theta_{max}$. Further, when $T_i$ is greater than $T_2$, the control valve is set to a minimum open angle (which may be closed), $\theta_{min}$. When $T_i$ is between $T_1$ and $T_2$, the angle of the control valve is set according to a function that relates $T_i$ to the control value angle, $\theta_{ctrl}$. FIG. 9 also illustrates, at 904, the control valve and the control valve angle $\theta_{ctrl}$ and describes a relationship between mass flow rate of fluid through the control valve based on the control valve open angle $\theta_{ctrl}$.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, claimed subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A system, comprising:
    a fuel cell having a fuel cell inlet to receive preheated intake gas and a fuel cell outlet to release hot fuel cell exhaust;
    a heat exchanger (HX) having a HX cold-side inlet, a HX cold-side outlet, a HX hot-side inlet and a HX hot-side outlet; and
    a thermoelectric generator (TE) to generate electric energy based on a temperature differential between a TE cold-side and a TE hot-side, the TE comprising:
        a TE cold-side inlet to receive intake gases;
        a TE cold-side outlet coupled to the HX cold-side inlet;
        a TE hot-side inlet coupled to the fuel cell outlet to receive the hot fuel cell exhaust;
        a TE hot-side outlet coupled to the HX hot-side inlet to provide the hot fuel cell exhaust received at the TE hot-side inlet to the HX hot-side inlet; and
    a bypass control valve between the fuel cell outlet and the HX hot-side inlet, wherein the bypass control valve is adjustable to control an inlet temperature of the preheated intake gas received at the fuel cell inlet.

2. The system of claim 1, wherein the bypass control valve adjusts the inlet temperature of the preheated intake gas by enabling a portion of the hot fuel cell exhaust to bypass the TE hot-side inlet, wherein the portion of the hot fuel cell exhaust that bypasses the TE hot-side inlet is mixed with an output of the TE hot-side outlet and provided to the HX hot-side inlet.

3. The system of claim 2, further comprising a controller coupled to the bypass control valve, wherein, during operation, the controller adjusts an open angle of the bypass control valve to change the inlet temperature of the preheated intake gas, wherein the portion of the hot fuel cell exhaust that bypasses the TE hot-side inlet is controlled based on the open angle of the bypass control valve.

4. The system of claim 1, wherein the intake gases include an oxidizer.

5. The system of claim 1, wherein the fuel cell comprises a high temperature fuel cell.

6. The system of claim 1, wherein the fuel cell comprises a solid oxide fuel cell (SOFC).

7. The system of claim 1, wherein the TE comprises a radial element in which the hot fuel cell exhaust flows from the TE hot-side inlet to the TE hot-side outlet in parallel with the intake gases flowing from the TE cold-side inlet to the TE cold-side outlet.

8. The system of claim 1, wherein the HX comprises a counter-flow heat exchanger.

9. The system of claim 3, wherein the controller adjusts power output generated by the TE by adjusting the bypass control valve.

10. A platform, comprising:
a fuel cell to generate electric power;
a thermoelectric generator (TE) to generate additional electric power using a temperature differential between fuel cell exhaust from the fuel cell and fuel cell intake gases;
a heat exchanger (HX) to preheat the fuel cell intake gases before the fuel cell intake gases are provided to the fuel cell by recovering heat from the fuel cell exhaust after the fuel cell exhaust has passed through the TE; and
a controller to control a sum of the electric power and the additional electric power by controlling a bypass valve, wherein the bypass valve enables a portion of the fuel cell exhaust to bypass the TE, wherein the portion of the fuel cell exhaust that bypasses the TE is determined by the bypass valve, and wherein the portion of the fuel cell exhaust that bypasses the TE is provided to the HX along with the fuel cell exhaust received at the HX after passing through the TE.

11. The platform of claim 10, further comprising a fuel storage system to store fuel to be used by the fuel cell.

12. The platform of claim 10, further comprising an oxidizer storage system to store oxidizer to be used by the fuel cell.

13. The platform of claim 10, wherein the platform includes a mobile platform including at least one of a watercraft, an aircraft, a space craft, and a land-based vehicle.

14. The platform of claim 10, wherein the portion of the fuel cell exhaust that bypasses the TE is determined by an open angle of the bypass valve.

15. A method, comprising:
generating electric power using a fuel cell, wherein the fuel cell comprises an anode and a cathode, wherein the anode generates a first exhaust, and wherein the cathode generates a second exhaust;
generating additional electric power using a thermoelectric generator (TE) by:
routing the first exhaust from the anode of the fuel cell to a hot-side inlet of the TE, wherein the second exhaust is not routed to the hot-side inlet of the TE; and
routing fuel cell intake gases to a cold-side inlet of the TE;
preheating the fuel cell intake gases at the TE; and
controlling a temperature of the fuel cell intake gases by adjusting a bypass valve, wherein the fuel cell intake gases are further preheated by enabling a portion of the first exhaust to bypass the hot-side inlet of the TE via the bypass valve and mixing the portion of the first exhaust with the fuel cell intake gases.

16. The method of claim 15, the method further comprising:
routing the first exhaust from a hot-side outlet of the TE to a hot-side inlet of a heat exchanger (HX);
routing the fuel cell intake gases from a cold-side outlet of the TE to a cold-side inlet of the HX to recover additional heat from the first exhaust received from the hot-side outlet of the TE; and
preheating the fuel cell intake gases at the HX prior to mixing the fuel cell intake gases with the portion of the first exhaust.

17. The method of claim 15, wherein the portion of the first exhaust that is mixed with the fuel cell intake gases is controlled by adjusting an open angle of the bypass valve.

18. The method of claim 15, wherein a temperature of the first exhaust before entering the hot side inlet of the TE is between about 600 degrees C. and about 800 degrees C.

19. The method of claim 15, wherein a temperature of the fuel cell intake gases before entering the TE is less than about 50 degrees C.

20. The method of claim 15, further comprising:
generating additional electric power using a second TE by:
routing the second exhaust from the cathode of the fuel cell to a hot-side inlet of the second TE, wherein the first exhaust is not routed to the hot-side inlet of the second TE; and
routing second fuel cell intake gases to a cold-side inlet of the second TE;
preheating the second fuel cell intake gases at the second TE; and
controlling a temperature of the second fuel cell intake gases by adjusting a second bypass valve, wherein the second fuel cell intake gases are further preheated by enabling a portion of the second exhaust to bypass the hot-side inlet of the second TE via the bypass valve and mixing the portion of the second exhaust with the second fuel cell intake gases.

21. A method comprising:
generating electric power using a fuel cell, wherein the fuel cell comprises an anode and a cathode, wherein the anode generates a first exhaust, and wherein the cathode generates a second exhaust;
generating additional electric power using a thermoelectric generator (TE) by:
routing the second exhaust from the cathode of the fuel cell to a hot-side inlet of the TE, wherein the first exhaust is not routed to the hot-side inlet of the TE; and
routing fuel cell intake gases to a cold-side inlet of the TE;
preheating the fuel cell intake gases at the TE; and
controlling a temperature of the fuel cell intake gases by adjusting a bypass valve, wherein the fuel cell intake gases are further preheated by enabling a portion of the second exhaust to bypass the hot-side inlet of the TE via the bypass valve and mixing the portion of the second exhaust with the fuel cell intake gases.

22. The method of claim 21, the method further comprising:
routing the first exhaust from a hot-side outlet of the TE to a hot-side inlet of a heat exchanger (HX);
routing the fuel cell intake gases from a cold-side outlet of the TE to a cold-side inlet of the HX to recover additional heat from the second exhaust received from the hot-side outlet of the TE; and
preheating the fuel cell intake gases at the HX prior to mixing the fuel cell intake gases with the portion of the second exhaust.

* * * * *